United States Patent

Cohen et al.

[11] Patent Number: 6,063,442
[45] Date of Patent: May 16, 2000

[54] BONDING OF POROUS MATERIALS TO OTHER MATERIALS UTILIZING CHEMICAL VAPOR DEPOSITION

[75] Inventors: Robert C. Cohen, Rockaway Township, N.J.; Joseph R. Vargas, Garnerville, N.Y.

[73] Assignee: Implex Corporation, Allendale, N.J.

[21] Appl. No.: 09/179,119

[22] Filed: Oct. 26, 1998

[51] Int. Cl.[7] .................................................. C23C 16/08
[52] U.S. Cl. ....................... 427/250; 427/2.26; 427/253
[58] Field of Search .............................. 427/2.24, 2.26, 427/248.1, 250, 252, 253

[56] References Cited

U.S. PATENT DOCUMENTS 2,130,879  9/1938  Dobke ................................. 228/124.6
5,282,861  2/1994  Kaplan ..................................... 623/16

*Primary Examiner*—Timothy Meeks
*Attorney, Agent, or Firm*—Arthur L. Plevy; Buchanan Ingersoll PC

[57] ABSTRACT

A process for bonding a porous material having an opened porous cellular structure to a substrate material, the process including the steps of: conditioning the substrate with tantalum in a reactor at 925° C. having a tantalum source pot at 550° C.; affixing the porous material to the conditioned substrate to form an affixed composite structure by clamping the porous material to the conditioned substrate; and, subjecting the composite structure to a chemical vapor deposition process (CVD) which uses tantalum as a source material for a time sufficient to CVD bond the porous material to the conditioned substrate material.

11 Claims, 2 Drawing Sheets

BONDING OF POROUS MATERIALS TO OTHER MATERIALS UTILIZING CHEMICAL VAPOR DEPOSITION

This invention relates to the high temperature bonding of porous materials to other materials utilizing a chemical vapor deposition (CVD) process to produce continuous layers of a desired material, generally metallic, deposited at the porous material and the host material interface.

BACKGROUND OF THE INVENTION

While the invention is not particularly limited to medical devices, it is indicated at the onset that a wide use of open-cell tantalum structures have been employed for bone implants and cells as well as tissue receptors. The use of materials such as sold under the trademark HEDROCEL by Implex Corporation, the assignee herein, utilizes a metallic porous cellular structure which is a biomaterial containing tantalum. Such structures are extremely useful and for example, are described in detail in U.S. Pat. No. 5,282,861 issued on Feb. 1, 1994, and entitled "OPEN CELL TANTALUM STRUCTURES FOR CANCELLOUS BONE IMPLANTS AND CELL AND TISSUE RECEPTORS" to Richard B. Kaplan and assigned to Ultramet of Pomona, Calif.

In that patent there is described the need for a cancellous bone substitute and/or cell and tissue receptive material. The "Background of the Invention" of the '861 patent gives detail on the prior art as well as various structures that are employed. In the patent there is described a reticulated open cell carbon foam which is infiltrated with tantalum by the chemical vapor deposition (CVD) process.

It is noted that niobium which has similar chemical and mechanical properties to tantalum may also be used as well as appropriate alloys of tantalum and niobium. A carbon foam is infiltrated by chemical vapor deposition (CVD). The resulted lightweight strong porous structure basically resembles the microstructure of bone and acts as a matrix for the incorporation of bone or for the reception of cells and tissues. The pores of this particular material are connected to one another to form continuous uniform channels of no dead ends. This network of interconnected pores provides optimal permeability in a high surface area to encourage cell and tissue ingrowth. It is desirable to utilize a material such as that and bond that material to another metallic layer or to another substrate.

SUMMARY OF THE INVENTION

This invention involves the use of CVD processes which are generally used for thick or thin film applications not involving with bonding of different components together. More specifically, this invention is related to the novel use of continuous CVD layers to bond porous materials as described above, for example, to metal, ceramic, vitreous carbon or pyrolitic carbon substrates or devices made of these substrate materials. The invention to be described is concerned with the deposition of plated layers that are formed utilizing a CVD process. The unique characteristic of CVD layers is that the chemical elements composing the layer can be deposited at the porous material bonding site to form a tough encapsulating layer that bridges or fills the gaps between the material surfaces to be bonded. This makes for a very useful composite material for many medical and other applications.

DETAILED DESCRIPTION OF THE INVENTION

Figure 1:
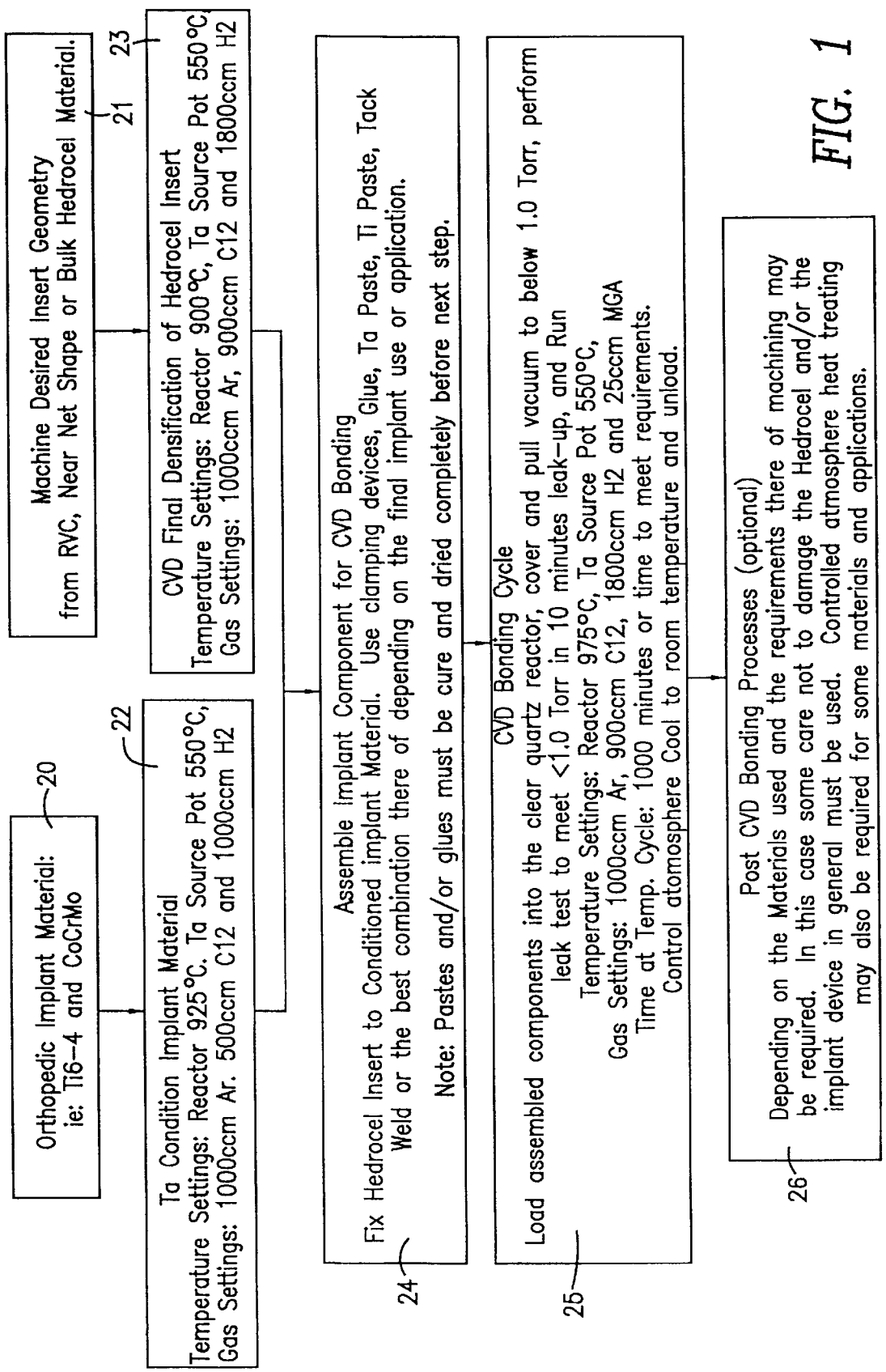
FIG. 1 is a general flowchart for the CVD bonding process according to this invention.

Before proceeding with a description of the preferred embodiment of the invention, it is understood that the invention involves but does not restrict the use of CVD processes with thin or thick film applications, which do not involve bonding of different components. Specifically as indicated above, this invention is related to the novel use of continuous CVD layers to bond different components, one being a porous material and the other a metal, ceramic, vitreous carbon and/or pyrolitic carbon substrate or device made of these materials. The host substrate material for the porous material may be quite different, similar and/or the same in nature as the porous material. The CVD layer can be of a single metallic element such as tantalum but the present techniques are not limited to a specific element and/or alloys of different metallic compositions. Depending on the application, different CVD layer compositions may be desirable. This invention, as will be described, can be employed with all materials that can be deposited using CVD processes with the intent that the deposited layer be involved with the bonding of the selected porous material to another host substrate material. Thus the intent of the invention is to bond by CVD bonding a porous material to a substrate layer to form a composite material useful in medical and other applications.

As indicated above, HEDROCEL is sold by the Implex Corporation and essentially is a metallic porous cellular structure containing tantalum. HEDROCEL has been CVD bonded to Ti 6-4 (Titanium 6-4) using tantalum (as the source material to form the continuous CVD layers).

While the invention is not limited to metal components, it has a particular applicability to the above-described structure. As will be explained, metallographic evaluation of the tantalum layer deposited indicated that the porous material surfaces that were reasonably close to the Ti 6-4 substrate surface were bridged and bonded. It has been noticed that there can be a significant amount of inter-diffusion between metallic materials in both substrates and the deposited layer. The HEDROCEL cellular structure biomaterial was also bonded to CoCrMo, pyrolitic carbon and aluminum oxide substrate materials ($Al_2O_3$).

In the case of ceramic and pyrolitic carbon, the bonding was due to the tantalum primarily due to encapsulating the substrate materials while the tantalum layer chemically interacts with the HEDROCEL. As would be expected, significant interdifusion of the tantalum layer and the ceramic or the pyrolitic carbon at the CVD bonding temperatures used was not noticed. The desired end product and application governs the selection of the CVD process parameters and materials used.

This invention applies equally to layers formed by pure gaseous CVD processes, where the source material(s) do not come in physical contact with the components to be bonded. For example, pure chlorine gas can be used to react with a particular source material such as tantalum, at a set temperature between 490° C. and 650° C. Halide gases are formed which transport the desired elements to the surfaces to be bonded. This is done under vacuum or with a positive flow of inert carrier gas. When bonding HEDROCEL tantalum cellular porous material to Ti 6-4 solid material, the halide gas such as tantalum penta-chloride ($TaCl_5$), three-dimensionally infiltrates through the porous material to the substrate bonding surface. Hydrogen gas ($H_2$) is introduced and is transported along with the halide gas to the bonding surfaces. At the desired bonding sites, the temperature is appropriately controlled to reverse the above-mentioned reaction to form HCL gas and releasing the source material to form the bond layer on all exposed surfaces. For tantalum, the desired deposition temperature is between 890° C. and 1100° C.

It should be understood that this invention CVD is not limited to pure gaseous CVD. CVD is used here to describe diffusion coating processes, includes all out of contact process. Contact processes such as pack and slurry diffusion processes, alloy powder slurries brushed or sprayed as well as slurry electrophoresis processes can be used to deposit the layer before component assembly. Layers are included where the chemical deposition process is carried out to create a bond at the interface of a porous material to another material. A powder mixture, (pack or slurry), in contact with or near the part or substrate to be bonded, contains the element or elements to be deposited (source material), a halide salt (activator), and an inert diluent (filler). When the mixture is heated the activator reacts to produce an atmosphere enriched with the source element halides such as tantalum chloride which diffuse in the pack and transfer to the bonding sites where the CVD layer is formed.

While the present invention is not restricted to the bonding of any particular materials, it employs a process in conjunction with the bond layer formed and described herein. The bonding method is applicable to a wide variety of metals, alloys, ceramics, graphites, high temperature glasses, pyrolitic carbon and vitreous carbon material combinations. According to the present invention, any of the CVD processes can be used. The deposited continuous layer must be of sufficient thickness and toughness to bridge the gap between the materials to be bonded. The CVD techniques used to demonstrate explain the process to represent any and all CVD techniques that can be conventionally employed.

Referring to FIG. 1, there is shown a general flowchart for the. CVD bonding process. Essentially, each of the rectangular modules is designated by a reference numeral to describe the particular process step. It is of course understood, as indicated above, that other CVD techniques can be employed.

At the left side, module 20 represents the orthopaedic implant material, which as indicated above, is Ti 6-4 or CoCrMo or a combination of both. At the right, the machine desired insert geometry is specified which insert is fabricated from a porous material such as RVC or the HEDROCEL material. A type of HEDROCEL porous material is more particularly described in U.S. Pat. No. 5,282,861, which shows an open-cell tantalum structure. Other open-cell or porous materials can be utilized in place of the material described in module 21.

As seen, the orthopaedic implant material (Ti 6-4, CoCrMo) is then conditioned as shown in module 22. In this particular process, it is conditioned for a tantalum condition implant. Note that in some cases the tantalum layer(s) will be only be applied to specific areas on the component or will be removed from certain areas during subsequent process steps as per the design requirements. Temperature settings are specified, for example the reactor is set at 925° C., tantalum source material is set at 550° C., the gas flow settings are 1000 ccm of Argon (Ar), 500 ccm of Chlorine ($Cl_2$) and 1000 ccm of Hydrogen ($H_2$). As shown in module 23, the CVD final densification of the HEDROCEL insert, is done by setting the reactor at 90° C. the tantalum source at 550° C., with gas settings 1000 ccm of Argon, 900 ccm of $Cl_2$ and 1800 ccm of $H_2$. The two treated materials are then assembled as an implant component for CVD bonding. For example, the tantalum condition implant material from module 22 is now assembled together with the material from module 23. The material as indicated in module 21 can assume any type of shape such as an implant for a hip stem or a knee implant or any type of prosthesis or other shape and this implant is now to be bonded to the implant material.

Module 24 indicates that the assembled implant is then combined together for CVD bonding. For example, the HEDROCEL insert is fixed to the conditioned implant material using any type of clamping device or bonding material such as a glue, tantalum paste, titanium paste, in some applications tack welding may be used. Any combination of the aforementioned can be incorporated depending on the final implant use and design. In other words, in module 24 the entire component is assembled and held together by means of a typical bond which is not a permanent bond. Then the assembled component from module 24 is subjected to the CVD bonding cycle.

As shown in module 25 one loads the assembled components into a clear quartz reactor for CVD, covers and pulls a vacuum to below 1.0 torr. Leak tests are performed to meet the vacuum requirements as indicated in module 25. The temperature settings are also shown in module 25 where the reactor is set at 975° C., the tantalum source is 550° C. and gas settings are 1000 ccm Argon, 900 ccm $Cl_2$, 1800 ccm $H_2$ and 25 ccm MGA. Time at temperature is 1,000 minutes or the time sufficient to perform a CVD bonding of the two materials. The atmosphere is normally controlled during the bonding layer deposition process and the cooling to room temperature and the component is unloaded.

After the CVD bonding occurs, there can be a post CVD bonding process which is indicated in module 26 as optional. Depending on the materials used, further requirements or machining may be required. In this case some care has to be made not to damage the porous metal or the HEDROCEL components and/or the implant device in general must be used. Controlled atmosphere heat treating may also be required for some materials and applications.

As one can see from the general flowchart, it is the main objective of the present invention to bond a porous material to other materials using a chemical vapor deposition (CVD) technique. The unique characteristic of CVD layers is that the chemical elements composing the layer can be deposited at the porous material bonding site to form a tough encapsulating layer that will bridge or fill the gaps between the material surfaces to be bonded.

As indicated, the CVD process is very well known and such a typical process is, for example, described in the above-noted patent U.S. Pat. No. 5,282,861. Essentially the CVD process utilizes a reaction chamber which can enclose a chlorination chamber or other gas chamber and a hotwall furnace. Some type of heater, for example a resistance heater, surrounds the chambers and an induction heating coil can surround the reaction chamber to heat the furnace. Metals such as tantalum can be located within the chlorination chamber and a substrate would also be positioned within the hotwall furnace. Chlorine gas and other gasses as indicated above react with the tantalum and the open-cell material to CVD bond. As indicated the tantalum chloride mixes with hydrogen which is also injected into the chamber and then passes through an opening in the chamber as an opening in a hotwall furnace. The mixture as indicated is heated to produce reactions so that the gasses assure that there is a vapor deposition of materials and a bonding of the materials.

While indicated above the substrate to be used is Ti 6-4 and CoCrMo, other substrates can be employed as well. It is also noted that there are many advances being made in the CVD fields such as plasma assisted CVD and other techniques which are being explored and utilized in the semiconductor field. It is anticipated that such techniques may also be employed in conjunction with this invention.

One can employ plasma enhanced chemical vapor deposition (PECVD). PECVD is a widely accepted technique for the deposition of dielectric films such silicon nitride and silicon oxide. PECVD has also been employed for the deposition of refractory metals and so on.

It is therefore understood that while the above techniques particularly describe a conventional CVD process, it is understood that other processes can be utilized to bond porous materials to other materials using the vapor deposition technique.

Figure 2:
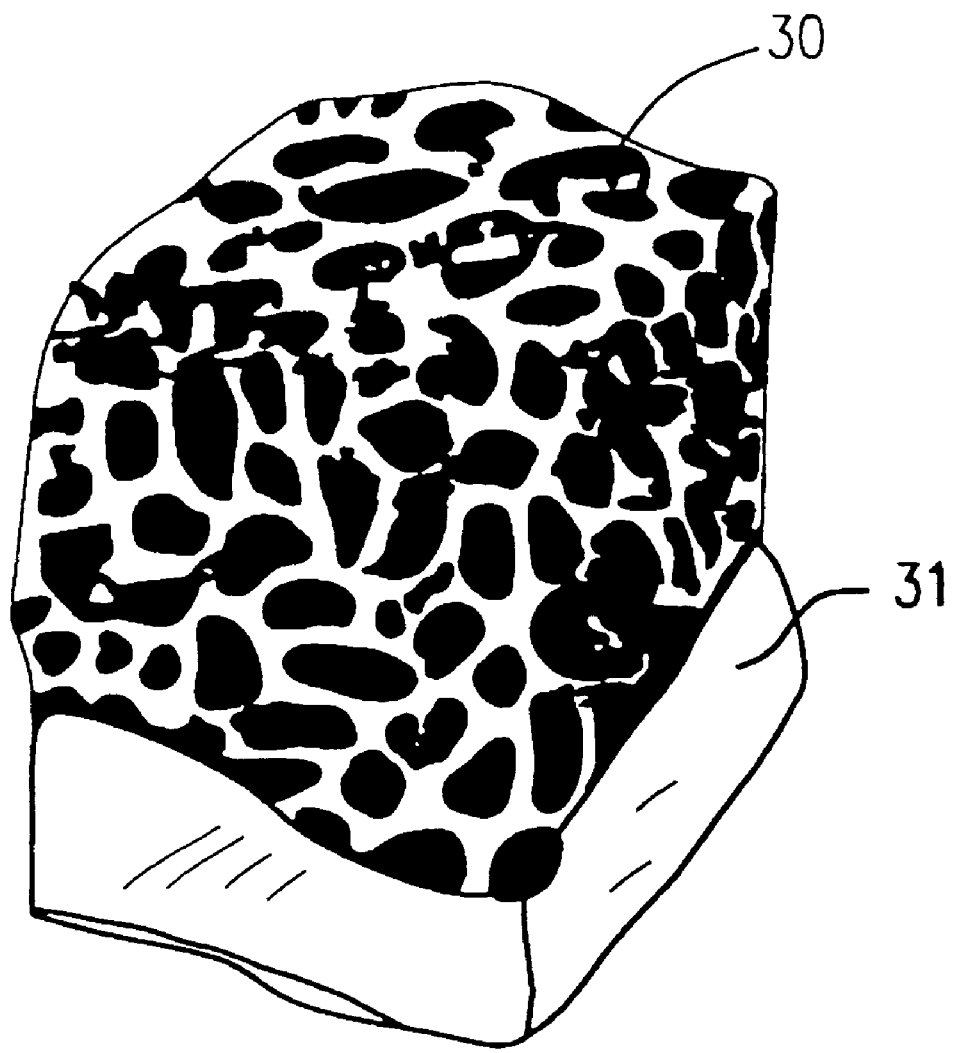
FIG. 2 is a schematic diagram of a composite material fabricated according to this invention.

Referring to FIG. 2, there is shown a composite material provided by this invention. Essentially, reference numeral 30 depicts a porous material which as indicated previously it is preferably a tantalum open-cell structure which could be formed by chemical vapor deposition by use of a reticulated carbon foam substrate. While tantalum is described, it is of course understood that other materials can be utilized as well.

As seen from FIG. 2, the material while being porous can be shaped into many configurations simple or complex. This can be done by shaping the raw carbon substrate prior to metal infiltration or it can be done by typical machining techniques. For purposes of illustration, the porous material is also referred to by the trademark HEDROCEL and is shown by reference numeral 30. The material is bonded to a substrate 31 which as indicated above can be many materials including Ti 6-4 and CoCrMo and other materials as well. It is of course explained and indicated above that these materials are many.

It is the major purpose of the invention to produce a composite article as shown in FIG. 2 which uses CVD layers to bond porous materials to metal, ceramic, vitreous carbon and/or pyrolitic carbon substrates or devices made of such materials. It is of course again repeated that the host substrate material for the porous material may be quite different, similar and/or the same in nature as the porous material thus substrate 31 can be extremely different or similar to porous material 30. It is noted that porous material 30 and substrate 31 are bonded together using a chemical vapor deposition technique.

It is also noted that both the porous material 30 and the substrate material 31 can be pre-treated as explained above. Hence either material can be further treated with tantalum using a CVD process to further coat the material before bonding substrate 31 to porous material 30 using a continuous CVD process.

What is claimed:

1. A process for bonding a porous material having an opened porous cellular structure to a substrate material, said process comprising the steps of:
    conditioning said substrate with tantalum in a reactor at 925° C. having a tantalum source pot at 550° C.;
    affixing said porous material to said conditioned substrate to form an affixed composite structure by clamping said porous material to said conditioned substrate; and,
    subjecting said composite structure to a chemical vapor deposition process (CVD) which uses tantalum as a source material for a time sufficient to CVD bond said porous material to said conditioned substrate material.

2. The process according to claim 1 wherein said porous material is a metallic porous cellular structure material containing tantalum.

3. The process according to claim 1 wherein said substrate is titanium.

4. The process according to claim 1 wherein said substrate is CoCrMo.

5. The process according to claim 1 wherein said reactor uses argon, chlorine and hydrogen gases during said conditioning.

6. The process according to claim 1, further comprising the step of CVD densifying said porous material prior to CVD bonding it to said substrate.

7. The process according to claim 6 wherein said step of CVD densification includes placing said porous material in a reactor housing a tantalum source and using argon, chlorine and hydrogen gases.

8. The process according to claim 7 wherein the temperature of said reactor is 900° C.

9. The process according to claim 8 wherein gas settings of said reactor are 1000 ccm Ar, 900 ccm $Cl_2$ and 1800 ccm $H_2$.

10. The process according to claim 1 wherein said chemical vapor deposition for bonding includes;
    placing said composite structure in a reactor having a tantalum source pot and using argon, chlorine and hydrogen gases for a time sufficient to bond said porous material to said conditioned substrate material.

11. The process according to claim 10 wherein said reactor is a quartz reactor at a temperature of about 925° C. with said source pot at about 550° C.

* * * * *